United States Patent

Hsu et al.

Patent Number: 6,043,518
Date of Patent: Mar. 28, 2000

[54] MULTIPLE-FUNCTION GAAS TRANSISTORS WITH VERY STRONG NEGATIVE DIFFERENTIAL RESISTANCE PHENOMENA

[75] Inventors: Wei-Chou Hsu; Chang-Luen Wu, both of Tainan, Taiwan

[73] Assignee: National Science Council, Taipei, Taiwan

[21] Appl. No.: 09/022,027

[22] Filed: Feb. 11, 1998

Related U.S. Application Data

[62] Division of application No. 08/556,135, Nov. 9, 1995.

[51] Int. Cl.[7] .......................... H01L 29/812; H01L 47/00
[52] U.S. Cl. .................. 257/192; 257/8; 257/24
[58] Field of Search ............... 257/6, 8, 26, 27, 257/29, 192, 194, 280

[56] References Cited

U.S. PATENT DOCUMENTS

| | | | |
|---|---|---|---|
| 5,060,234 | 10/1991 | Schubert et al. | 372/45 |
| 5,323,030 | 6/1994 | Kosica et al. | 257/195 |
| 5,488,237 | 1/1996 | Kuwata | 257/194 |

FOREIGN PATENT DOCUMENTS 0 603 737 A2  6/1994  European Pat. Off. .

*Primary Examiner*—John Guay
*Attorney, Agent, or Firm*—Friscia & Nussbuam

[57] ABSTRACT

Disclosed in this invention is a new four-terminal type and multiple delta-doped transistors with multiple functions grown by low-pressure metalorganic chemical vapor deposition (LP-MOCVD). All the epilayers are grown on $n^+$-GaAs substrates. The real-space transfer transistors (RST), the collector is located under the substrate, reveal very strong negative differential resistance phenomena. The RST structure using an InGaAs channel manifests superior characteristics of a very high peak-to-valley current ratio up to 430,000 at room temperature, a peak current as high as 100 mA, very sharp charge injection, and a valley current as broad as 5.5V. Meanwhile, high performance heterostructure field effect transistors can be implemented on the same wafer by further evaporating a gate between source and drain electrodes. In order to significantly reduce leakage current, an ohmic recession is made at the source and drain. These new multiple-functions device may be used in high-speed, low-noise, and/or high power microwave oscillators and amplifiers.

8 Claims, 4 Drawing Sheets

MULTIPLE-FUNCTION GAAS TRANSISTORS WITH VERY STRONG NEGATIVE DIFFERENTIAL RESISTANCE PHENOMENA

This application is a divisional of co-pending U.S. patent application Ser. No. 08/556,135 filed on Nov. 9, 1995, which application is entirely incorporated herein by reference.

This invention relates to multiple-function GaAs transistors with very strong negative differential resistance phenomena. The change of electrical current and voltage in the ordinary transistor is linear with the current increasing as the voltage increases. In the case of negative differential resistance, the current increases when the voltage increases until the voltage reaches a threshold value which causes a sharp decrease in the current.

BACKGROUND OF THIS INVENTION

To date, the developed S or N type negative differential resistance (NDR) devices in the world are applied extensively in the high-speed switches or high frequency oscillator. meanwhile, a real space transfer device is designed on the basis of the principle that by using voltage, electrons move at high speed to produce energy. When the energy exceeds a threshold value of the potential energy in the epitaxy, the electrons conduct (transfer) vertically to the adjacent epitaxy with the scattering effect of the atomic lattice. The change of electron location is called real space transfer (RST). The applications of the real space transfer devices that use hot electron emission include microwave generations, high-speed logical circuits, programmable random access memory elements and photo emission devices have high potential. The major operation modes of real space transfer devices are the three terminal type negative resistance field-effect transistor (NERFET) and the charge injection transistor (CHINT).

However, most of the research relating to real space transfer over-emphasize the heterostructure of the AlGaAs/GaAs, AlGaAs/InGaAs/GaAs and InAlAs/InGaAs/InP systems. From the views of this RST structure in different systems, the Al component included structures may produce the deep energy level complex center (DX centers) which will affect the device characteristics. Another similar case in the structure of the AlGaAs and AlGaAs/InGaAs/GaAs, since the mobility of the AlGaAs barrier is much lower than that of GaAs barrier structure, the valley current range of the AlGaAs is narrower. In addition, since the doped efficiency of the AlGaAs is lower, attempting to increase the peak current value is not easy.

A heterostructure that relates to the high performance δ-doped GaAs/InGaAs structure is proposed by C. Y. Chang et al. (1991) in the *Japanese Journal of Applied Physics*, pages 1158–1165. A δ-doped layer is a maximally-concentrated doped layer with the distribution of heterogeneity (impurity or foreign matter) to be restricted within a distributed single atomic layer in semiconductor materials. Herein, the heterostructure field-effect transistor system (HFET) which is prepared with GaAs/InGaAs materials reveals an effective improvement of the deficit that is mentioned above. In order to effectively improve the deficits and promote the real-space transfer characteristics, four types of multiple-function transistors, which simultaneously possess real space transfer and field effect transistor (FET) behavior, are proposed in this invention.

SUMMARY OF THE INVENTION

The main purpose of this invention is to apply the GaAs/InGaAs material system and δ-doped techniques to a real space transfer (RST) transistor. Since the δ-doped layer is used as the carrier supplier, the peak current will be enhanced even when the peak current is over 100 mA, and strengthened the current driving capability. This concept will solve the problem of conventional doped methods which exhibit the low concentration of the AlGaAs due to the lower doped efficiency and reveals generally a current under 20 mA.

Another purpose in this invention is to utilize the ohmic recession technology to prepare the four terminal devices that have both simultaneously field effect transistor (FET) and real space transfer (RST) behaviors. This device possesses the advantage of a simple structure, ease of growth and fabrication, and attain the effects that can be produced by a large quantity process.

This invention attempts to solve the problems and technical extents that involve AlGaAs barrier mobility, and real space transfer devices fabricated with molecular beam epitaxy technology.

The mobility of the AlGaAs barrier is too low in the conventional real space transfer device resulting in the valley current range being narrow. In this invention, the adopted GaAs/InGaAs material system has a GaAs barrier with higher mobility. Therefore, the transconductance-gate voltage curve in the field effect transistor (FET) characteristic can be flatter. It can thus provide a larger linear amplification application and also cause a wider valley current range for a real space transfer device.

Most conventional real space transfer devices utilize molecular beam epitaxy (MBE) technology. Most conventional real space transfer devices fabricated are three terminal structures which also have a planar type transfer. In this invention, the metalorganic chemical vapor deposition (MOCVD) system that can be used for the large scale manufacture is used. The collector is evaporated on the vertical real space transfer structure of n$^+$-GaAs substrate with the gate evaporated between a source and a drain. A transistor which has both high performance real space transfer and field effect properties can be produced.

BRIEF DESCRIPTIONS OF THE TABLES AND THE DRAWINGS

Table 1 shows the growth conditions.

Table 2 shows the transmission data between each structure layer.

Figure 1:
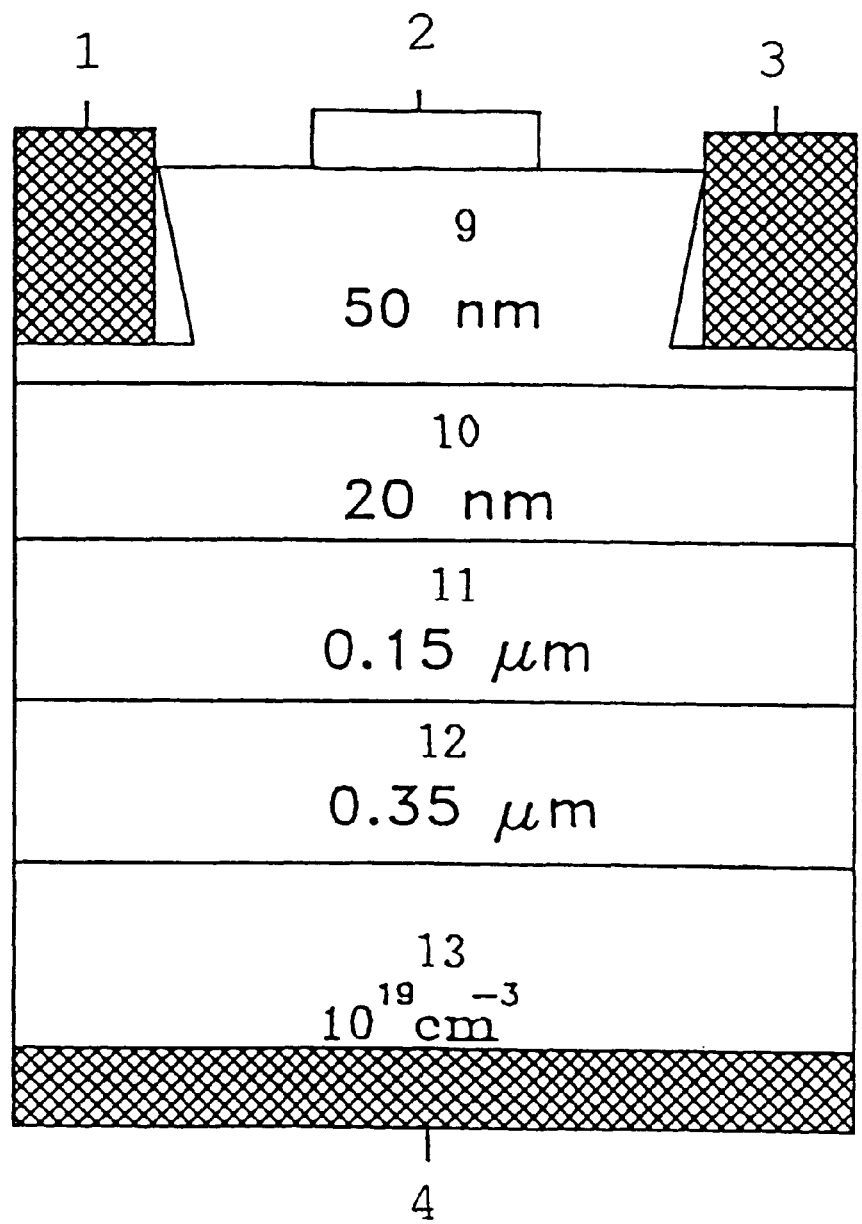
FIG. 1 shows the uniformly doped GaAs structure.

Reference numerals in the drawings are as follows:

| | |
|---|---|
| 1. | source |
| 2. | gate |
| 3. | drain |
| 4. | collector |
| 5. | δ1-doped carrier supplier (FIGS. 3–4) |
| | δ-doped channel (FIG. 2) |

-continued

| | |
|---|---|
| 6. | δ2-doped carrier supplier |
| 7. | δ3-doped carrier supplier |
| 8. | δ4-doped carrier supplier |
| 9. | i-GaAs cap layer |
| 10. | i-GaAs channel layer |
| 11. | i-GaAs barrier layer |
| 12. | i-GaAs buffer layer |
| 13. | n$^+$-GaAs |
| 14. | GaAs |
| 15. | GaAs space layer |
| 16. | In$_{0.25}$Ga$_{0.75}$As emitter channel layer |
| 17. | GaAs barrier layer |
| 18. | GaAs buffer layer |
| 19. | GaAs tunneling layer |

DETAILED DESCRIPTION OF THE INVENTION

Four types of new four terminal, single and multiple doped layer transistors with multiple functions grown by metalorganic chemical vapor deposition (MOCVD) have been fabricated successfully. These transistors are all grown on a n+-GaAs substrate. The real space transfer transistors, with a collector located under the substrate, reveal extremely strong negative differential resistance phenomena. The RST structure using an InGaAs channel manifests superior characteristics of a very high peak-to-valley current ratio up to 432,000 at room temperature, a peak current as high as 100 mA, a very sharp charge injection, and a valley current range as broad as 5.5V. As long as a gate is deposited between the source and drain electrodes on one wafer, the transistor will possess both extrinsic transconductance that approaches 200 mS/mm (the length of a gate is 2 μm) and high performance heterostructure field effect characteristics simultaneously. These new multiple-function devices may be used in high-speed, low-noise, and/or high power microwave oscillator and amplifier.

The preparation process of this invention utilizes standard photolithography and lift-off technology. The steps include mesa etching preparation, photo resistance, exposure, image development, and dipping the wafer into the etching solution to proceed to the undoped GaAs buffer layer.

The ohmic contact metalization process of the collector electrode is to evaporate the Au—Ge alloy on the surface of the substrate backside. An ohmic recession is made by reprocessing the photo resistance, exposure, image development, and then etching the cap layer with the etching solution, lifting off the photo resistance, evaporating process to the ohmic recession surface and sintering. Finally, after processing the Schottky contacts, performing metalization, photo resistance, exposure, image development, and depositing Au to make a gate electrode.

The whole process of the device preparation can be divided into three sets of steps: 1) mesa etching preparation; 2) ohmic contact metalization; and 3) Schottky contacts metalization step.

During mesa etching preparation, every device should be isolated to avoid interaction, which causes current leakage. The chip is dipped into the etched solution (NH$_4$OH:H$_2$O$_2$:H$_2$O=5:3:100) for 30 seconds to proceed to the undoped GaAs buffer layer. The photo resistance is then cleaned with acetone (ACE).

The ohmic contact metalization step is suitable to be used in n-type carrier devices by using an Au—Ge alloy (Au 88%, Ge 12%) for the drain electrode, the source electrode and the substrate backside collector ohmic contacts. In addition, a thin silver layer is evaporated on the surface of the Au—Ge alloy for reducing the serial resistance of the probe. In order to avoid the fracture of gate metal during preparation, judging the direction of the chip layer growth is necessary. Then, the surface fat is eliminated through the cleaning step, and the drain and source patterns are made using the AZ1400 positive photo resistance. The chip is dipped into the etched solution (NH$_4$OH:H$_2$O$_2$:H$_2$O= 5:3:100) for etching the recess for about 6 seconds before the evaporating step. The ammonia buffer (NH$_4$OH:H$_2$O=1:1) solution is used to clean the covered oxidation layer for 10 seconds. The evaporating step proceeds under pressure of $8 \times 10^{-6}$ torr. Then acetone is used for removing the photo resistance and unnecessary metals. The residual parts are only the drain and source electrode metals. Then, after cleaning the chip, the chip is loaded into a 450° C. high temperature furnace for sintering the ohmic contacts after evaporating the AuGe and silver metal on the backside of chip directly for approximately 5–10 seconds.

The Schottky contacts metalization step is similar to the ohmic contact metalization step. Au is used as the gate metal and the sintering process is omitted. The whole device fabrication is finished after completion of these steps.

In the preparation process, the low pressure metalorganic chemical vapor deposition process is used for preparing the single- and multiple-doped layers transistor. This growth system includes: 1) gas handling system; 2) bypass line; 3) reactor chamber and heating system; and 4) automatic pressure control system (APC) and pumping system. The low pressure metalorganic chemical vapor deposition system can be separated into four parts. The merits of the low pressure metalorganic chemical vapor deposition process include: 1) this method produces sophisticated semiconductor thin epilayers can be grown; 2) this method is very simple and can attain the mass production goal after changing the reactor design; and 3) this method avoids poisonous gas leakage. But the disadvantages include: 1) the chemical solutions used in fabrication can cause corrosion and cancer; 2) the fabrication is carried out under high vacuum; 3) the metalorganic-organic and hydride sources are toxic, presenting a fatal danger when the concentration reaches 5 ppm. The safety of the humans should be provided for.

Herein, the gas handling system inputs the metalorganic of III group sources into the isothermal tank for producing a stable saturation vapor. The gas handling system then carries out the vapor with hydrogen gas. The flow rate of the hydrogen gas can be monitored with a mass flow controller. Therefore, the actual organic source flow rate can be obtained with the flow express equation.

First, all gas sources are assumed to be matched under the ideal gas law, and the gas phase reaction does not occur. Then gas sources satisfy the relationship:

$$Nm/Nh = Pm/Ph \tag{1}$$

where

Nm represents the mole fraction of the metalorganic sources,

Pm represents the saturation vapor (a function of temperature),

Nh represents the mole fraction of hydrogen gas, and

Ph represents its pressure.

Second, the pressure at the exit of the metal organic sources in the pipe and the grown pressure (Ps) in the reactor are assumed to be the same, since the exit pressure is the sum of the hydrogen pressure and metal organic source. Then, $$Ps=Pm+Ph \qquad (2)$$

from (1) and (2)

$$Nm=Nh*Pm/Ph=Nh*Pm/(Ps-Pm) \qquad (3)$$

formula (3) can be changed into the flow express equation:

$$Fm=Fh*Pm/(Ps-Pm)$$

In this equation, Fh represents the hydrogen flow rate of the hydrogen into the bubbler and Fm is the actual flow rate of the metalorganic sources.

On the other hand, the sources of the V group and n-type dopant are the hydrides that are diluted by hydrogen gas. The reaction sources are rapidly conducted into the reactor after being mixed with the epifold. Due to the dead area being only 0.02 cc between the epifold and the main line, the low pressure metalorganic chemical vapor deposition system provides more capability to fabricate the device.

1. The Gas Treating System

After the Pd-film diffusion and purification procedure, the hydrogen gas is used as the carrier gas and pipe purge gas. The III group sources used as the metalorganic sources, which are stored in the isothermal tank for maintaining a stable saturation vapor in the system. The vapor is carried out by hydrogen gas, and the hydrogen flow rate can be monitored by a mass flow controller. Therefore, the actual organic source flow rate can be obtained.

2. Bypass Line

In order to grow high quality multiple-epilayers, the reaction source flow rate must be stably controlled. The reaction source flow rate is set in the bypass line which is conducted into the main line during the growth. Thus, the pressure transient can be reduced by adjusting the flow rate of hydrogen in the bypass line to balance the growth pressure.

3. The Reactor and Heating System

The reactor, supplied by Thomas & Swan Co. (England), is a horizontal type chamber constructed with fused quartz. The reactor shape causes the gas flow type to be planar and produces the homogeneous growth. The cooling-water jacket on the top of the growth zone maintains the cooling effect during the device growth. The grown substrate is loaded on a Mo susceptor tilting 3° with an active deposition area. In the substrate terminal, a hole is bored for inserting the thermocouple for measuring the substrate growth temperature. The end terminal of the quartz pipe is a contractible and relax tube bundle with an O-ring for easy insertion and removal into the substrate. During the growth period, the platinum resistance wire is used for heating the susceptor. An Eurotherm type temperature controller, manufactured in Britain, is used for controlling the temperature. During growth, the set temperature in the reactor can stably be controlled and the revealed error is about 1° C.

4. The Automatic Pressure Control System and Pumping System

In order to make sure the system is stable during the growth process, it is necessary to use an automatic pressure control system. The automatic pressure control system structure includes four parts: pressure sensor, pressure display, pressure controller, and an exhaust throttle valve. The servo-motor activates the throttle valve and controls the valve controller. The valve controller compares the reactor pressure with the set pressure, and then an error signal is given. This error signal controls the servo-motor to drive the throttle valve and keep the reactor pressure constant. The automatic pressure control system (APC) will automatically operate and adjust to the set pressure if the reactor internal pressure has any variation. In this system, two sets of pumps are used in the main line and the bypass line, respectively, in order to stabilize the pressure during growth. The pump set in the main line should allow for a large extraction gas rate.

On the other hand, the substrate cleaning steps influence the epitaxy quality significantly. The elimination impurity dust, fat, and damage on the surface of the wafer is the main purpose of the substrate cleaning steps. The best surface of the wafer faces toward the resolution and growth of the reacting gas source under the reaction environment. Therefore, before loading a wafer, careful cleaning of the wafer should occur. The basic cleaning steps can be described as: 1) dipping the wafer into various solutions sequentially and ultrasonic cleaning for 10 minutes; 2) rinsing the wafer with an appropriate solution; 3) blowing the wafer dry with a high purity nitrogen gas; and 4) loading the wafer into the reactor and completely sealing the reactor. The used solutions generally includes trichloroethylene (TCE), acetone (ACE), and methanol. The appropriate use of solutions includes a secondary deionized water rinsing for 10 minutes, etching solution, $H_2SO_4:H_2O_2:H_2O=5:1:1$ for 4 to 5 minutes, rinsing for 5 minutes with secondary deionized water once again, rinsing for 1 minute with ammonia water (1:1) for eliminating the oxidation layer, and finally rinsing for 5 minutes with secondary deionized water once again.

The purge is a process where the temperature in the reactor increases because the main line pump activates after the wafer is loaded into the reactor. The process will lead to a fully dry surface of the substrate and susceptor. The whole system is purged with high purity hydrogen gas, and the grown chip will be a high quality product. The growth pressure, temperature, main line and bypass line hydrogen gas flow rate should be set and adjusted. During the growth process, this system is controlled by a computer. The input data include the growing epitaxy layer categories and the growth time of each layer. When the reactor temperature reaches 250° C., $AsH_3$ in the bypass line is switched into the reactor to prevent the substrate from decomposing. The computer will automatically control the switch of the solenoid valve in the gas epifold. The reaction source will be switched into the reactor to proceed with epitaxy at the appropriate time. The computer will immediately switch off the platinum resistance wire heater after the growth is finished, and temperature decreases and the system is purged with hydrogen gas.

By virtue of the standard photolithography, lift-off technology and the ohmic recession technology application, the transistor device can be made. Using the GaAs/InGaAs raw material system and δ-doped technique for RST transistors, the four-terminal type and multiple function transistors, which are a field effect transistor (FET) and have real space transfer (RST) characteristics, have been studied and fabricated successfully. The δ-doped technique is done by switching off the Ga sources and opening the As sources and Si dopant sources.

Figure 2:
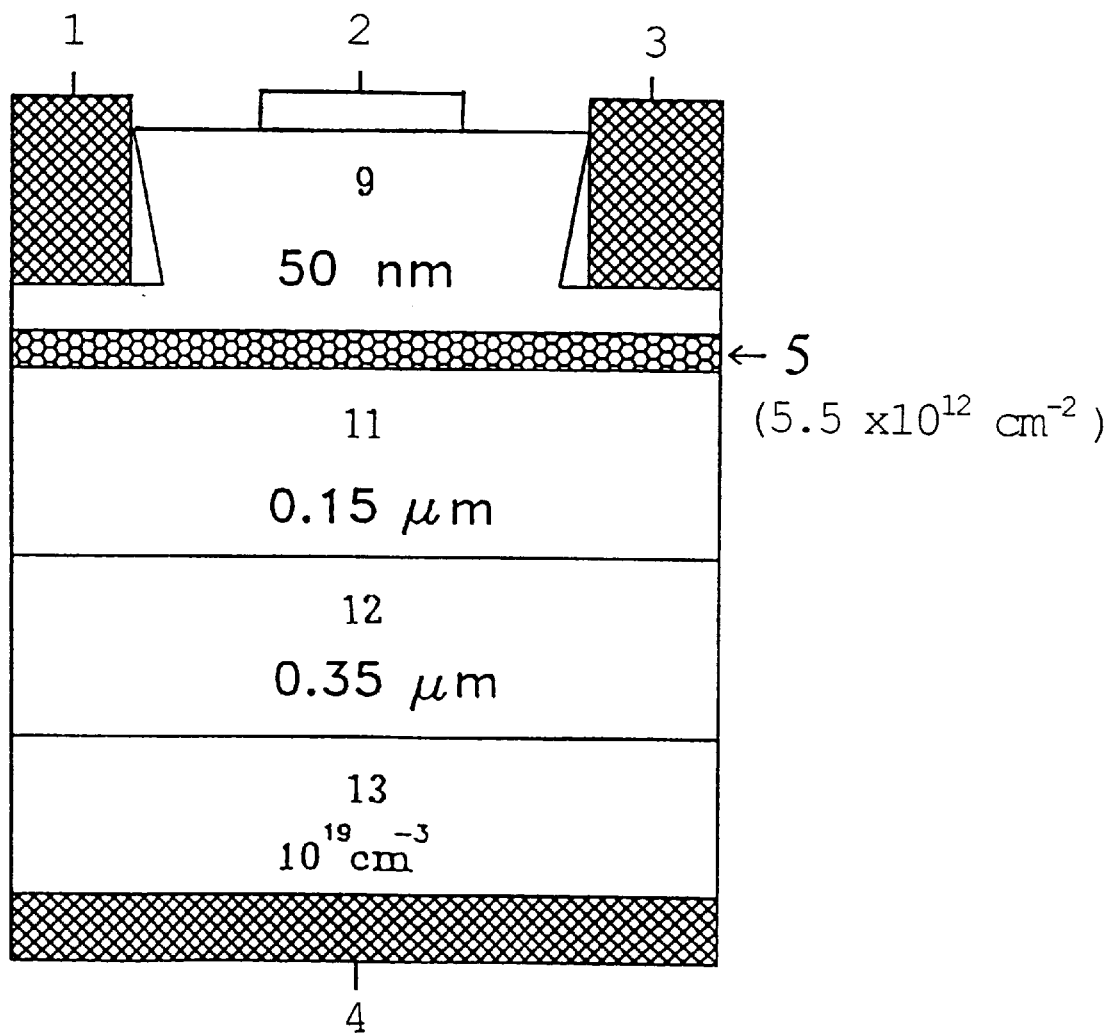
FIG. 2 shows the δ-doped GaAs structure.
Figure 3:
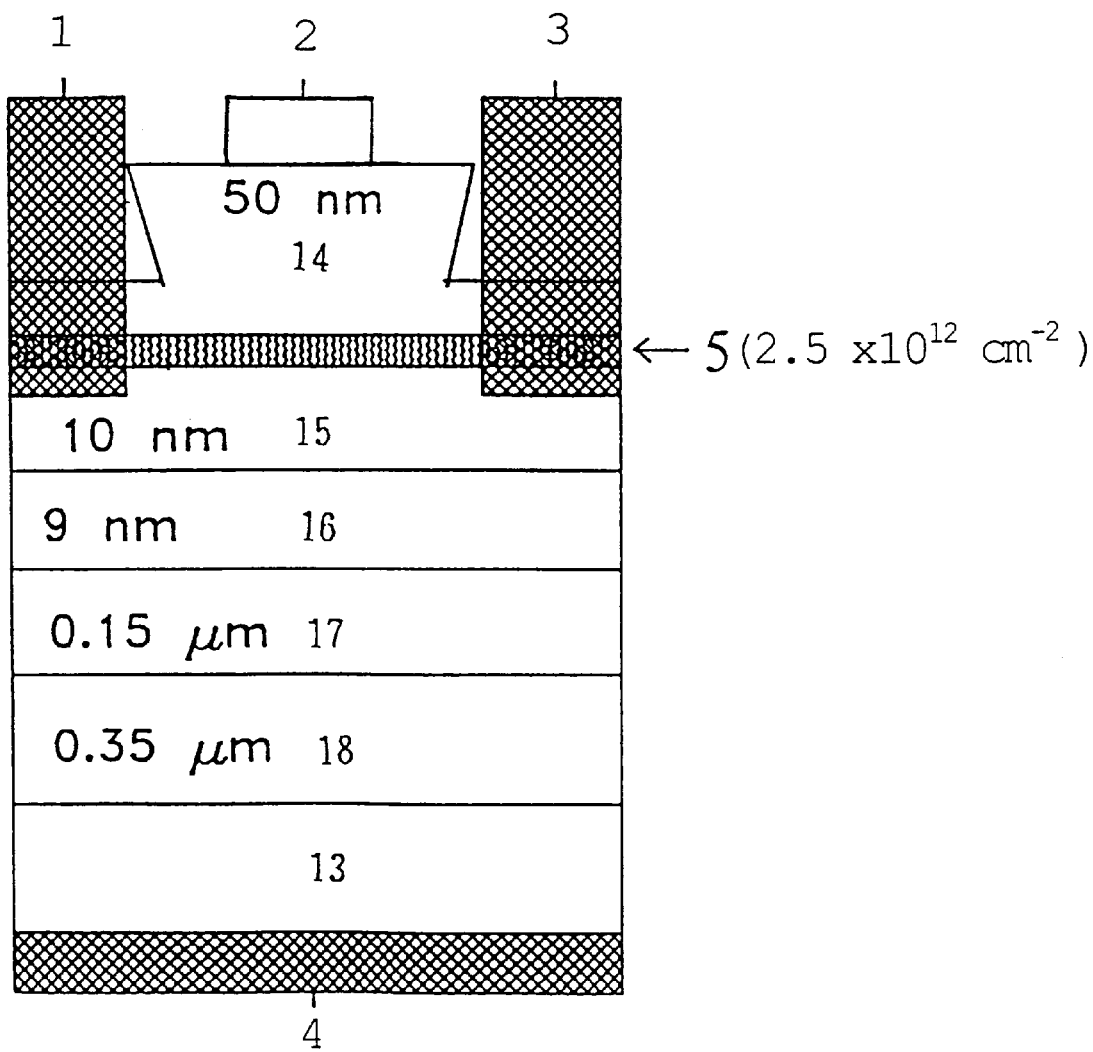
FIG. 3 shows the single layer δ-doped GaAs/InGaAs structure.
Figure 4:
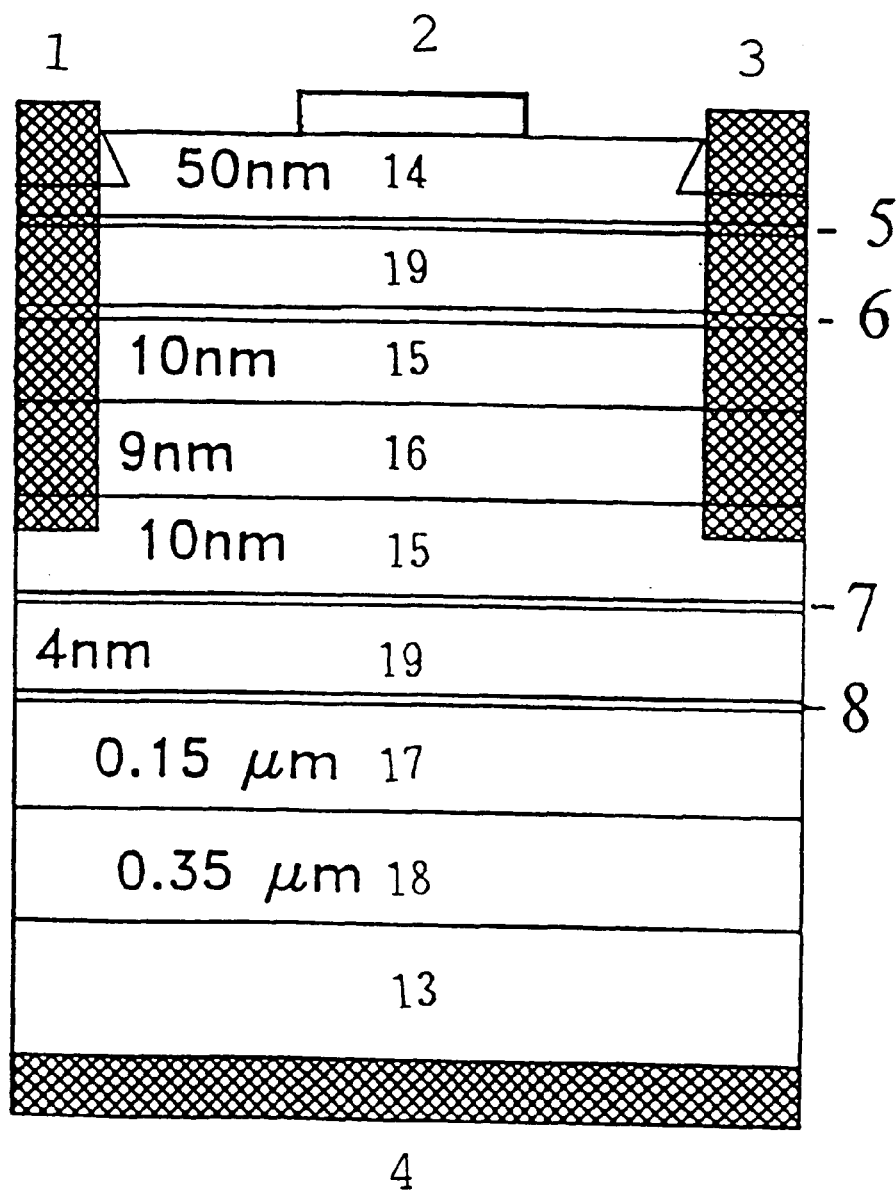
FIG. 4 shows the multiple layers δ-doped GaAs/InGaAs structure.

There are four different structures in this invention as shown in FIGS. 1–4. Herein, FIG. 1 is a uniformed doped GaAs structure, FIG. 2 is a δ-doped GaAs structure, FIG. 3 is a single layer δ-doped GaAs/InGaAs structure, and FIG. 4 is a multiple layered δ-doped GaAs/InGaAs structure.

In these structures, collector 4 is an electrode which is connected to the epitaxy to collect electrons. Electrons move at an accelerating speed in the fields gaining energy. When the energy exceeds the maximal value of the potential energy in the epitaxy, electrons conduct (transfer) vertically to the adjacent epitaxy.

All transistors are grown by a low pressure metalorganic chemical vapor deposition (LP-MOCVD) method. The growth conditions are shown in Table 1.

Each layer state of the four structures in this invention are described as the following:

Structure (1) grows by the low-pressure metalorganic chemical vapor deposition (LP-MOCVD) method on the $n^+$-GaAs ($10^{19}$cm$^{-3}$) substrate. The n-type GaAs ($2\times10^{15}$ cm$^{-3}$) grows 0.35 $\mu$m, followed by a 0.15 $\mu$m n-type GaAs ($5\times10^{14}$ cm$^{-3}$), and a 20 nm n-type GaAs ($5\times10^{18}$ cm$^{-3}$), and finally a 50 nm n-type GaAs ($5\times10^{14}$ cm$^{-3}$) is deposited.

Structure (2) grows by the low-pressure metalorganic chemical vapor deposition (LP-MOCVD) method on the $n^+$-GaAs ($10^{19}$ cm$^{-3}$) substrate. The n-type GaAs ($2\times10^{15}$ cm$^{-3}$) grows 0.35 $\mu$m, followed by a 0.15 $\mu$m n-type GaAs ($5\times10^{14}$ cm$^{-3}$), and a silicon $\delta$-doping layer ($5.5\times10^{12}$ cm$^{-2}$), and finally a 50 nm n-type GaAs ($5\times10^{14}$ cm$^{-3}$) is deposited.

Structure (3) grows by the low-pressure metalorganic chemical vapor deposition (LP-MOCVD) method on the $n^+$-GaAs ($10^{19}$ cm$^{-3}$) substrate. The n-type GaAs ($2\times10^{15}$ cm$^{-3}$) grows 0.35 $\mu$m, followed by a 0.15 $\mu$m n-type GaAs ($5\times10^{14}$ cm$^{-3}$), a 9 nm undoped $In_{0.25}Ga_{0.75}As$ emitter channel layer, a 10 nm n-type GaAs ($5\times10^{14}$ cm$^{-3}$) and a silicon $\delta$-doping layer ($2.5\times10^{12}$ cm$^{-2}$), and finally a 50 nm n-type GaAs ($5\times10^{14}$cm$^{-3}$) is deposited.

Structure (4) grows by the low-pressure metalorganic chemical vapor deposition (LP-MOCVD) method on the $n^+$-GaAs ($10^{19}$ cm$^{-3}$) substrate. The n-type GaAs ($2\times10^{15}$ cm$^{-3}$) grows 0.35 $\mu$m, followed by the sequence of: a 0.15 $\mu$m n-type GaAs ($5\times10^{14}$ cm$^{-3}$), a silicon $\delta$-doping layer ($1.6\times10^{12}$ cm$^{-2}$), a 4 nm n-type GaAs ($5\times10^{14}$ cm$^{-3}$), silicon $\delta$-doping layer ($1.6\times10^{12}$ cm$^{-2}$), a 10 nm n-type GaAs ($5\times10^{14}$ cm$^{-3}$), a 9 nm undoped $In_{0.25}Ga_{0.75}As$ emitter channel layer, a 10 nm n-type GaAs ($5\times10^{14}$ cm$^{-3}$), a silicon $\delta$-doping layer ($1.6\times10^{12}$cm$^{-2}$), a 4 nm n-type GaAs ($5\times10^{14}$ cm$^{-3}$), a silicon $\delta$-doping layer ($1.6\times10^{12}$ cm$^{-2}$), and finally a 50 nm n-type GaAs ($5\times10^{14}$ cm$^{-3}$) is deposited.

Being able to use a metal organic chemical vapor deposition (MOCVD) epitaxy system that can be used in mass-production is the advantage of this invention. The growth and processing are very easy. The AlGaAs epitaxy film growth is not necessary, and the creation of DX centers can be avoided during the growth process. The four-terminal type and multiple-function transistor device that simultaneously are a field effect transistor (FET) and have real space transfer (RST) characteristics have been studied and manufactured using the ohmic recession technology. The transconductance of the field effect transistor can reach 195 mS/mm with a gate length of 2 $\mu$m. The RST structure using an InGaAs channel manifests superior characteristics of a very high peak-to-valley current ratio reaching 432,000 at room temperature, and a peak current as high as 100 mA, as listed in Table 2. These are the highest values in the RST structures at the present time. Therefore, these new multiple-functions device can be used as high-speed, low-noise, and/or high power microwave oscillators and amplifiers, and still achieve the high power and current driving capabilities.

APPLICATION EXAMPLES

Example 1

The Manufacture Process of the Devices

1. The preparation of the mesa etching

Every device should be processed through photo resistance, exposure and image development steps. The chip is dipped into the etching solution ($NH_4OH:H_2O_2:H_2O=$ 5:3:100) for 30 seconds to eliminate the photo resistance with acetone (ACE).

2. The ohmic contact metalization

The Au-Ge alloy (Au 88%, Ge 12%) is applied as the materials for the drain electrode, the source electrode and the substrate backside collector ohmic contacts. An ohmic recession is made after reprocessing the photo resistance, exposure image development, etching the cap layer with the etching solution, lifting off the photo resistance, and evaporating process. In addition, a thin silver layer is deposited on the surface of the Au—Ge alloy, and then the surface fat is eliminated through the cleaning step. Finally, the drain and source electrodes photo cap are made by using the AZ1400 positive photo resistance. The chip is dipped into the etched solution ($NH_4OH:H_2O_2:H_2O=5:3:100$) for etching the recess for about 6 seconds before the evaporating step, and followed by the ammonia water ($NH_4OH:H_2O=1:1$) solution to clean the covered oxidation layer for 10 seconds The evaporating step proceeds under an atmosphere of $8\times10^{-6}$ torr. Acetone is then used to remove the photo resistance and unnecessary metals. The residual parts are only the drain and source electrode metals. After cleaning the chip, the chip is loaded into the 450° C. high temperature furnace for sintering for about 5 to 10 seconds to make the ohmic contacts by evaporating the AuGa and silver metal on the backside of the chip directly.

3. The Schottky contacts metalization step

This step is similar to the ohmic contact metalization step. Au is used as the gate metal without the sintering procedure.

Example 2

The Growth System and Epitaxy

1. The gas treating process

The hydrogen flow rate can be read from a mass flow controller. Therefore, the actual organic source flow rate can be obtained from a suitable formula.

2. The substrate cleaning step

The first basic cleaning step is dipping the substrate into various solutions and oscillating with an ultrasound device for 10 minutes. The used solutions sequentially include trichloroethylene (TCE), acetone (ACE), and methanol. Second, rinsing the substrate with an appropriate solution. The appropriate solution steps include secondary deionized water rinsing for 10 minutes, etching solution, $H_2SO_4:H_2O_2:H_2O=5:1:1$ for 4 to 5 minutes, rinsing for 5 minutes with secondary deionized water once again, rinsing for 1 minute with ammonia water (1:1) for eliminating the oxidation layer, and rinsing for 5 minutes with secondary deionized water once again. Third, blowing a high purity nitrogen gas then loading the substrate into a reactor and completed sealing to the reactor.

3. Purge Step

This step is where the temperature in the reactor increases because the main line pump activates for 20 minutes after the substrate is loaded into the reactor. Then the throttle valve in the main line is turned off and maintaining the reactor pressure at $4\times10^{-3}$ torr. No leakage of the gas in the reactor is confirmed and reheat the system to 90° C. Keeping this temperature for 30 minutes will guarantee a fully dry wafer surface and susceptor. The whole system is purged with high purity hydrogen gas for 4 hours, and the grown film will be a high quality product.

4. The growth step

The growth pressure, temperature, main line, and bypass line hydrogen gas flow rate should be set and adjusted.

During the growth process, the system is controlled by a computer. The input data includes the growing epitaxy layer categories and the growth times of each layer. When the reactor temperature reaches 250° C., $AsH_3$ flowing in the bypass line is inputted into the reactor to prevent the substrate from decomposing.

The isothermal tank that deposited the metalorganic source has to be opened before growing for 30 minutes. The temperature of it will decrease to the set value and the system vapor pressure will be maintained in the stable state. The hydrides and the metalorganic are opened at the suitable time, and flow out from the bypass line with a set flow rate and stable state.

The microcomputer will automatically control the switch of the solenoid valve in the gas epifold. The reaction source will be switched into the reactor to fabricate the epitaxy at the suitable time. And the computer will immediately switch off the platinum resistance wire heater to decrease the temperature after the growth has finished, but keeping the $AsH_3$ in a flowing state is required to prevent the V group element from vaporization. Until 250° C., the source is switched off and purges the system for 30 minutes with hydrogen gas. The grown samples can be taken out after the residue reactants are cleaned out.

TABLE 1

THE GROWTH CONDITIONS

|  | GaAs cap layer | δ-dopping supplier layer | GaAs tunneling layer | GaAs spacer layer | InGaAs channel layer | GaAs barrier layer | GaAs buffer layer |
|---|---|---|---|---|---|---|---|
| TEG flow rate (10° C.) cm³/min | 5 | 0 | 5 | 5 | 5 | 5 | 30 |
| TMI flow rate (10° C.) cm³/min | 0 | 0 | 0 | 0 | 6.3 | 0 | 0 |
| $AsH_3$ flow rate (15.2%) l/min | 0.08 | 0.08 | 0.08 | 0.08 | 0.12 | 0.08 | 0.42 |
| $SiH_4$ flow rate (500 ppm) cm³/min | 0 | 100 | 0 | 0 | 0 | 0 | 0 |
| V/III ratio | 71.6 |  | 71.6 | 71.6 | 79.5 | 71.6 | 62.7 |
| Growth rate nm/mm | 17.5 |  | 17.5 | 17.5 | 31 | 17.5 | 110 |

TABLE 2

THE TRANSMISSION DATA BETWEEN THE STRUCTURE LAYERS

| | Negative Differential Resistance (NDR) | | Field Effect Transistor (FET) |
|---|---|---|---|
| | peak-to-alley current ratio (PVCR) | power density (PW) | transconductance (gm) |
| structure | 2160 | 440 mW/mm | 70 mS/m |
| structure | 23500 | 740 mW/mm | 100 mS/mm |
| structure | 432000 | 855 mW/m | 110 mS/m |
| structure | 56000 | 565 mW/m | 195 mS/m |

What is claimed is:

1. A multiple-function GaAs transistor structure comprising:

a $n^+$-GaAs ($10^{19}$ cm$^{-3}$) substrate, a n-type GaAs ($2\times10^{15}$ cm$^{-3}$) buffer layer of 0.35 μm thickness, a n-type GaAs ($5\times10^{14}$ cm$^{-3}$) barrier layer of 0.15 μm thickness, a n-type GaAs ($5\times10^8$ cm$^{-3}$) active channel of 20 nm thickness, and a n-type GaAs ($5\times10^{14}$ cm$^{-3}$) cap layer of 50 nm thickness; and wherein each of said layers situated in this order on said substrate.

2. A multiple-function GaAs transistor structure comprising:

a $n^+$-GaAs ($10^{19}$ cm$^{-3}$) substrate, a n-type GaAs ($2\times10^{15}$ cm$^{-3}$) buffer layer of 0.35 μm thickness, a n-type GaAs ($5\times10^{14}$ cm$^{-3}$) barrier layer of 0.15 μm thickness, an undoped $In_{0.25}Ga_{0.75}As$ active channel layer of 9 nm thickness, a GaAs ($5\times10^{14}$ cm$^{-3}$) spacer layer of 10 nm thickness, a n-type silicon delta-doping carrier supplier layer ($2.5\times10^{12}$ cm$^{-2}$), and a n-type GaAs ($5\times10^{14}$ cm$^{-3}$) cap layer of 50 nm thickness; and wherein each of said layers situated in this order on said substrate.

3. A multiple-function GaAs transistor structure comprising:

a $n^+$-GaAs ($10^{19}$ cm$^{-3}$) substrate, a n-type GaAs ($2\times10^{15}$ cm$^{-3}$) buffer layer of 0.35 μm thickness, a n-type GaAs ($5\times10^{14}$ cm$^{-3}$) barrier layer of 0.15 μm thickness, a n-type silicon delta-doping carrier supplier layer ($1.6\times10^{12}$ cm$^{-2}$), a n-type GaAs ($5\times10^{14}$ cm$^{-3}$) tunneling layer of 4 nm thickness, a n-type silicon delta-doping carrier supplier layer ($1.6\times10^{12}$ cm$^{-2}$), a n-type GaAs ($5\times10^{14}$ cm$^{-3}$) spacer layer of 10 nm thickness, an undoped $In_{0.25}Ga_{0.75}As$ active layer of 9 nm thickness, a n-type GaAs ($5\times10^{14}$ cm$^{-3}$) spacer layer of 10 nm thickness, a n-type silicon delta-doping carrier supplier layer ($1.6\times10^{12}$ cm$^{-2}$)

a n-type GaAs ($5\times10^{14}$ cm$^{-3}$) tunneling layer of 4 nm thickness, a n-type silicon delta-doping carrier supplier layer ($1.6\times10^{12}$ cm$^{-2}$), and a n-type GaAs ($5\times10^{14}$ cm$^{-3}$) cap layer of 50 nm thickness; and wherein each of said layers situated in this order on said substrate.

4. A multiple-function GaAs transistor structure comprising:

a n$^+$-GaAs ($10^{19}$ cm$^{-3}$) substrate, a n-type GaAs ($2\times10^{15}$ cm$^{-3}$) buffer layer of 0.35 µm thickness deposited on said n$^+$-GaAs substrate, a n-type GaAs ($5\times10^{14}$ cm$^{-3}$) barrier layer of 0.15 µm thickness deposited on said GaAs buffer layer, at least one layer comprising Ga and As in communication with said GaAs barrier layer, and an undoped GaAs ($5\times10^{14}$ cm$^{-3}$) cap layer of 50 nm thickness deposited above said at least one layer comprising Ga and As, said at least one layer comprising Ga and As includes a channel layer.

5. The multiple function GaAs transistor structure as recited in claim 4, wherein said channel layer is a n-type silicon δ-doped channel layer.

6. The multiple-function GaAs transistor structure as recited in claim 4, wherein at least one of said at least one layer comprising Ga and As is a GaAs spacer layer.

7. The multiple-function GaAs transistor structure as recited in claim 4, wherein at least one of said at least one layer comprising Ga and As is a GaAs tunneling layer.

8. The multiple-function GaAs transistor structure as recited in claim 4, wherein one of said at least one layer comprising Ga and As includes In.

* * * * *